United States Patent
Kato et al.

(10) Patent No.: US 10,297,626 B2
(45) Date of Patent: May 21, 2019

(54) SEMICONDUCTOR DEVICE

(71) Applicant: OLYMPUS CORPORATION, Hachioji-shi, Tokyo (JP)

(72) Inventors: Hideki Kato, Tokyo (JP); Yasunari Harada, Ebina (JP); Masato Osawa, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 23 days.

(21) Appl. No.: 15/794,474

(22) Filed: Oct. 26, 2017

(65) Prior Publication Data

US 2018/0047771 A1 Feb. 15, 2018

Related U.S. Application Data

(63) Continuation of application No. PCT/JP2015/063182, filed on May 7, 2015.

(51) Int. Cl.
*H04N 5/369* (2011.01)
*H01L 27/146* (2006.01)
(Continued)

(52) U.S. Cl.
CPC .. *H01L 27/14612* (2013.01); *H01L 27/14603* (2013.01); *H04N 5/351* (2013.01); (Continued)

(58) Field of Classification Search
CPC ........ H01L 27/14612; H01L 27/14603; H04N 5/369; H04N 5/3658; H04N 5/351; H04N 5/374; H04N 5/378
See application file for complete search history.

(56) References Cited

U.S. PATENT DOCUMENTS

| 7,593,047 B2 * | 9/2009 | Funakoshi | H04N 5/335 348/273 |
| 2012/0086095 A1 * | 4/2012 | Nishiyama | H01L 27/14609 257/432 |

(Continued)

FOREIGN PATENT DOCUMENTS

| JP | 63-142781 A | 6/1988 |
| JP | 2004-241495 A | 8/2004 |

(Continued)

OTHER PUBLICATIONS

International Search Report dated Jul. 21, 2015, issued in counterpart application No. PCT/JP2015/063182, w/English translation. (4 pages).

*Primary Examiner* — Shahbaz Nazrul
(74) *Attorney, Agent, or Firm* — Westerman, Hattori, Daniels & Adrian, LLP

(57) ABSTRACT

A semiconductor device includes a pixel array, a plurality of column circuits, an amplifier, switch arrays of a first layer to an $n^{th}$ layer, and signal lines of the first layer to the $n^{th}$ layer. n is an integer of two or more. The switch array of an $i^{th}$ layer is disposed between the switch array of an $(i+1)^{th}$ layer and the amplifier. i is an integer of one or more and less than n. The signal line of the first layer is connected to the $n^{th}$ amplifier. The signal line of the $n^{th}$ layer is connected to the switch array of the $n^{th}$ layer. Each of the plurality of switches included in the switch array of the $n^{th}$ layer is connected to the column circuit.

3 Claims, 7 Drawing Sheets

(51) Int. Cl.
*H04N 5/365* (2011.01)
*H04N 5/351* (2011.01)
*H04N 5/374* (2011.01)
*H04N 5/378* (2011.01)

(52) U.S. Cl.
CPC .......... *H04N 5/369* (2013.01); *H04N 5/3658* (2013.01); *H04N 5/374* (2013.01); *H04N 5/378* (2013.01)

(56) References Cited

U.S. PATENT DOCUMENTS

| | | | |
|---|---|---|---|
| 2017/0237915 A1* | 8/2017 | Ogura | H01L 27/14621 348/248 |
| 2018/0152656 A1* | 5/2018 | Matsumoto | H03M 1/46 |

FOREIGN PATENT DOCUMENTS

| | | |
|---|---|---|
| JP | 2009-290433 A | 12/2009 |
| JP | 2010-88460 A | 4/2010 |
| JP | 5120069 B2 | 1/2013 |
| WO | 2013/038815 A1 | 3/2013 |

\* cited by examiner

SEMICONDUCTOR DEVICE

This application is a continuation application based on International Patent Application No. PCT/JP2015/063182 filed on May 7, 2015, the contents of which are incorporated herein by reference.

BACKGROUND OF THE INVENTION

Field of the Invention

The present invention relates to a semiconductor device.

Description of Related Art

Circuits in which switches for outputting pixel signals read from pixels are arranged in a plurality of layers are disclosed in Japanese Patent Publication No. 5120069 and Japanese Unexamined Patent Application, First Publication No. S63-142781. FIG. 8 shows a configuration of a column selection switching unit 36 in the prior art. As shown in FIG. 8, the column selection switching unit 36 includes a plurality of column selection switches 31, a plurality of column output signal lines 32, a plurality of group selection switches 33, and one horizontal signal line 37. In FIG. 8, sixteen column selection switches 31, four column output signal lines 32, and four group selection switches 33 are arranged. Reference numerals of one column selection switch 31, one column output signal line 32, and one group selection switch 33 are shown as representatives in FIG. 8.

The plurality of column selection switches 31 are arranged in a row direction of a plurality of pixels that are not shown. The column selection switch 31 is a transistor. The column selection switch 31 includes a first terminal, a second terminal, and a gate. One of the first terminal and the second terminal of the column selection switch 31 is a source and the other is a drain. The first terminal of the column selection switch 31 is connected to a column circuit 25. The second terminal of the column selection switch 31 is connected to the column output signal line 32. The column output signal line 32 extends in the row direction. Four column selection switches 31 are connected to one column output signal line 32. The column selection switch 31 is turned on or off on the basis of a control signal input to the gate of the column selection switch 31.

The plurality of group selection switches 33 are arranged in the row direction. The group selection switch 33 is a transistor. The group selection switch 33 includes a first terminal, a second terminal, and a gate. One of the first terminal and the second terminal of the group selection switch 33 is a source and the other is a drain. The first terminal of the group selection switch 33 is connected to the column output signal line 32. The second terminal of the group selection switch 33 is connected to the horizontal signal line 37. The horizontal signal line 37 extends in the row direction. The group selection switch 33 is turned on or off on the basis of a control signal input to the gate of the group selection switch 33. The horizontal signal line 37 is connected to the amplifier 27.

Each group election switch 33 corresponds to four column selection switches 31. That is, each group selection switch 33 is connected to the column output signal line 32 to which four column selection switches 31 are connected. Four column selection switches 31 constitute one group.

The column circuit 25 processes the pixel signal output from the pixels. There are a plurality of column circuits 25, hut a reference numeral of one column circuit 25 is shown as a representative in FIG. 8. The amplifier 27 amplifies signals output from the plurality of column circuits 25.

Pixel signals output from each of the column circuits 25 are transmitted to the amplifier 27 via the column selection switch 31, the column output signal line 32, the group selection switch 33, and the horizontal signal line 37. When a pixel signal processed by one column circuit 25 is transmitted to the amplifier 27, one group selection switch 33 is on and the other three group selection switches 33 are off. For this reason, an influence of parasitic capacitance added to the horizontal signal line 37 is reduced by the three group selection switches 33 which are OFF.

SUMMARY OF THE INVENTION

According to a first aspect of the present invention, a semiconductor device includes a pixel array, a plurality of column circuits, an amplifier, switch arrays of a first layer to an $n^{th}$ layer, and signal lines of the first layer to the $n^{th}$ layer, n is an integer of two or more. The pixel array includes a plurality of pixels arranged in a matrix and the plurality of pixels output pixel signals. The plurality of column circuits are arranged to correspond to columns of the plurality of pixels and process the pixel signals. The amplifier amplifies signals output from the plurality of column circuits. The switch array includes a plurality of switches The switch array of an $i^{th}$ layer is disposed between the switch array of an $(i+1)^{th}$ layer and the amplifier. i is an integer of one or more and less than n. The signal line of the first layer is connected to the amplifier. The signal line of the $n^{th}$ layer is connected to the switch array of the $n^{th}$ layer. Each of the plurality of switches included in the switch array of the $n^{th}$ layer is connected to the column circuit. Each of the plurality of switches included in the switch array of the $i^{th}$ layer is connected to two or more of the plurality of switches included in the switch array of the $(i+1)^{th}$ layer by the signal line of the $(i+1)^{th}$ layer. The signal line of the $(i+1)^{th}$ layer is disposed in a first direction. The first direction is a row direction. A first distance between a reference line and a first switch in the first direction is less than a second distance between the reference line and a second switch in the first direction. The reference line is a straight line passing through the center of an array of the plurality of pixels and extending in a second direction perpendicular to the first direction. The first switch is the switch which is the farthest away from the reference line in the first direction among the plurality of switches included in the switch array of the first layer The second switch is the switch which is the farthest away from the reference line in the first direction among the plurality of switches included in the switch array of the second layer. A third distance between the reference line and a third switch in a third direction is less than a fourth distance between the reference line and a fourth switch in the third direction. The third direction is a direction opposite to the first direction. The third switch is the switch which is the farthest away from the reference line in the third direction among the plurality of switches included in the switch array of the first layer. The fourth switch is the switch which is the farthest away from the reference line in the third direction among the plurality of switches included in the switch array of the second layer. A fifth distance between the reference line and the amplifier in the first direction is less than a sixth distance between the reference line and a fifth switch in the first direction. The fifth switch is the switch which is the closest to the reference line among the plurality of switches included in the switch array of the first layer. The signal line of the second layer includes two signal lines. The reference line passes between the two signal lines of the second layer. A seventh distance between the reference line and a sixth switch in the first direction is less than an eighth distance between the reference line and a seventh switch in the first direction. The sixth switch is the switch which is the farthest away from the reference line in the first direction among the plurality of switches included in the switch array of a $j^{th}$ layer. j is an integer of two or more and less than n. The seventh switch is the switch which is the farthest away from the reference line in the first direction among the plurality of switches included in the switch array of a $(j+1)^{th}$ layer. A ninth distance between the reference line and an eighth switch in the third direction is less than a tenth distance between the reference line and a ninth switch in the third direction. The eighth switch is the switch which is the farthest away from the reference line in the third direction among the plurality of switches included in the switch array of the $j^{th}$ layer. The ninth switch is the switch which is the farthest away from the reference line in the third direction among the plurality of switches included in the switch array of the $(j+1)^{th}$ layer. A first width of the signal line of the first layer is less than a second width of the signal line of the second layer.

According to a second aspect of the present invention, in the first aspect, the plurality of pixels may output a first pixel signal in accordance with an amount of incident light. The plurality of column circuits may hold the first pixel signal.

According to a third aspect of the present invention, in the second aspect, the plurality of pixels may further output a second pixel signal when the plurality of pixels are reset. The plurality of column circuit lay further hold the second pixel signal. The plurality of column circuits ma further output a signal corresponding to a difference between the first pixel signal and the second pixel signal.

DETAILED DESCRIPTION OF THE INVENTION

Figure 1:
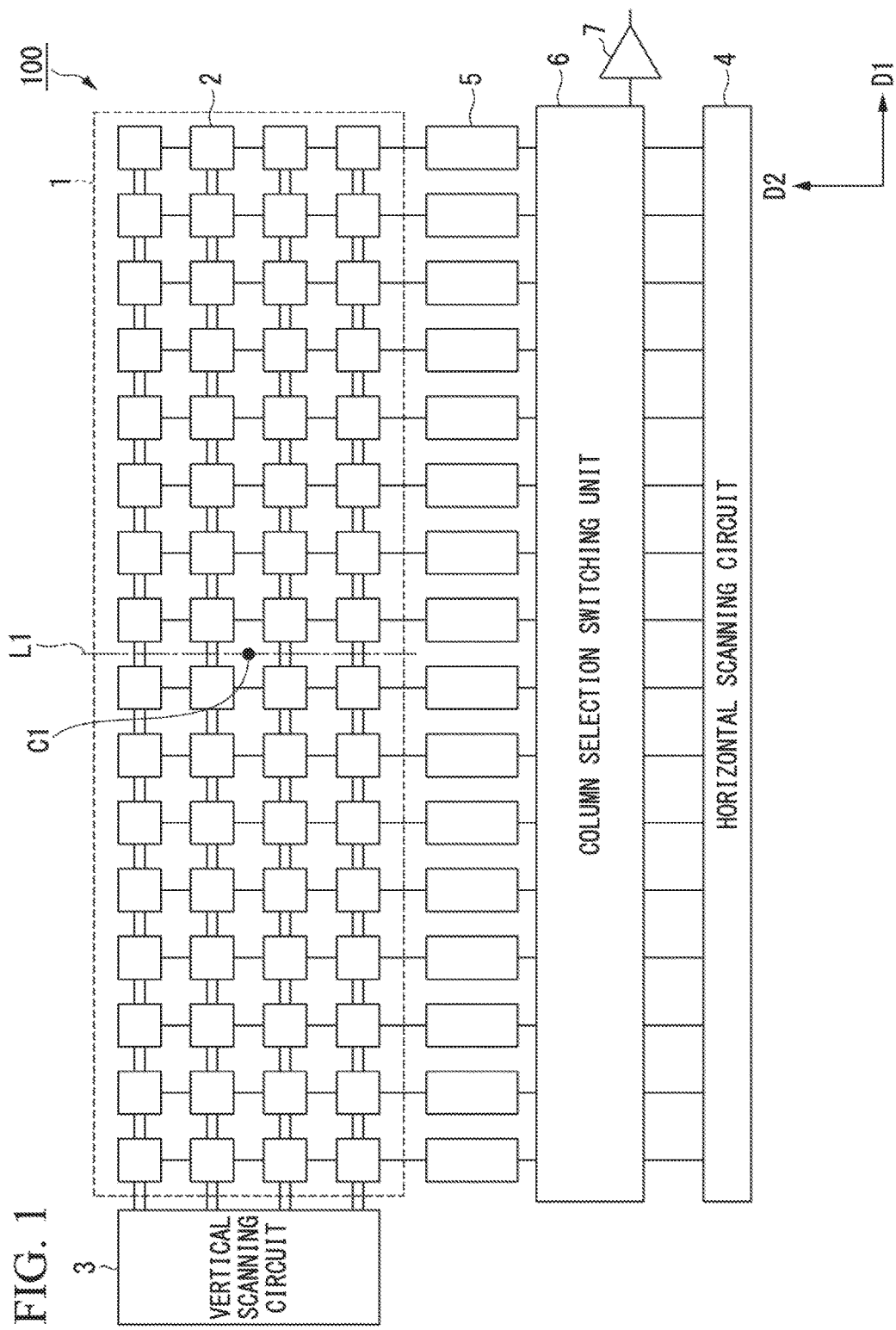
FIG. 1 is a block diagram which shows a configuration of a semiconductor device according to a first embodiment of the present invention.

Embodiments of the present invention will be described with reference to the drawings. FIG. 1 shows a configuration of a semiconductor device 100 of an embodiment of the present invention. The semiconductor device 100 is an imaging device (image sensor). As shown in FIG. 1, the semiconductor device 100 includes a pixel array 1, a vertical scanning circuit 3, a horizontal scanning circuit 4, a plurality of column circuits 5, a column selection switching unit 6, and an amplifier 7. The pixel array 1, the vertical scanning circuit 3, the horizontal scanning circuit 4, the plurality of column circuits 5, the column selection switching unit 6, and the amplifier 7 are arranged on a semiconductor substrate. 16 column circuits 5 are arranged in FIG. 1. In FIG. 1, a reference numeral of one column circuit 5 is shown as a representative.

The pixel array 1 has a plurality of pixels 2 disposed in a matrix. The plurality of pixels 2 output a pixel signal. The plurality of pixels 2 are arranged in a row direction, that is, a direction D1, and a column direction, that is, a direction D2. 64 pixels 2 are arranged in FIG. 1. In FIG. 1, a reference numeral of one pixel 2 is shown as a representative. In FIG. 1, the number of rows in an array of the plurality of pixels 2 is four, and the number of columns is 16. The direction D1 and the direction D2 are orthogonal to each other in a plane on which the plurality of pixels 2 are arranged.

The vertical scanning circuit 3 outputs a control signal for controlling the plurality of pixels 2 to the pixel array 1. Accordingly, the vertical scanning circuit 3 controls an operation of the plurality of pixels 2.

The plurality of column circuits 5 are arranged to correspond to columns of the plurality of pixels 2. The plurality of column circuits 5 process the pixel signals output from the plurality of pixels 2. For example, the plurality of column circuits 5 perform processing for removing noise from the pixel signals.

The column selection switching unit 6 includes a plurality of switches which output a pixel signal. A configuration of the column selection switching unit 6 will be described below.

The horizontal scanning circuit 4 outputs a control signal which controls a plurality of switches of the column selection switching unit 6 to the column selection switching unit 6. Accordingly, the horizontal scanning circuit 4 controls reading of a pixel signal.

The amplifier 7 amplifies a signal output from the plurality of column circuits 5. For convenience of illustration, the amplifier 7 is disposed at a position corresponding to a right end of the plurality of pixels 2 in FIG. 1.

The plurality of pixels 2 output a first pixel signal in accordance with an amount of incident light. The plurality of column circuits 5 hold the first pixel signal.

The plurality of pixels 2 further output a second pixel signal when the plurality of pixels 2 are reset. The plurality of column circuits 5 further hold the second pixel signal. The plurality of column circuits 5 further output a signal corresponding to a difference between the first pixel signal and the second pixel signal. Accordingly, the plurality of column circuits 5 can remove noise from the pixel signals.

Figure 2:
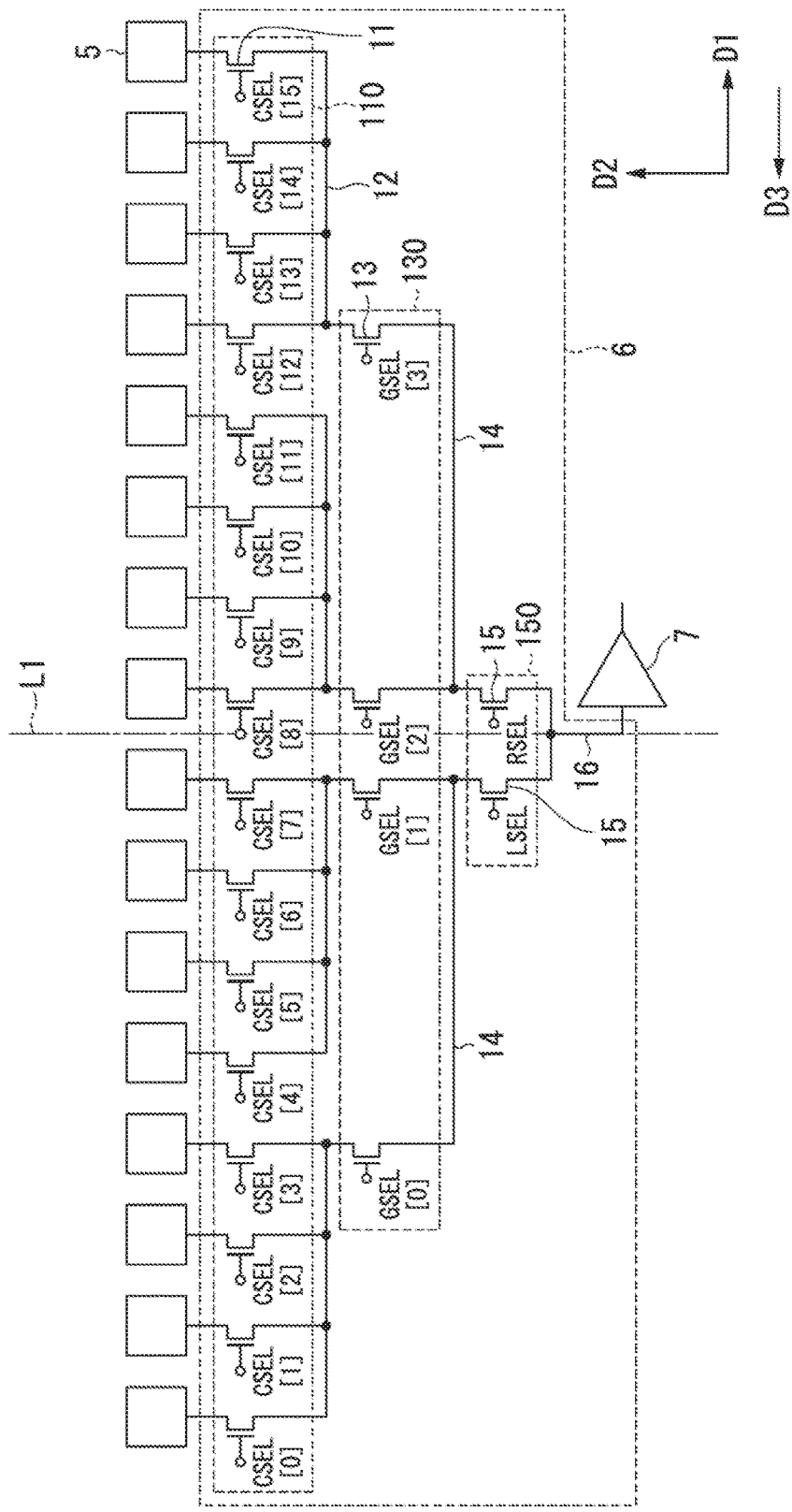
FIG. 2 is a circuit diagram which shows a configuration of a column selection switching unit in the semiconductor device according to the first embodiment of the present invention.

FIG. 2 shows a configuration of the column selection switching unit 6. As show in FIG. 2, the column selection switching unit 6 includes a plurality of column selection switches 11, a plurality of column output signal lines 12, a plurality of first group selection switches 13, a plurality of first group output signal lines 14, a plurality of second group selection switches 15, and one second group output signal line 16. Sixteen column selection switches 11, four column output signal lines 12, four first group selection switches 13, two first group output signal lines 14, and two second group selection switches 15 are arranged in FIG. 2. Reference numerals of one column selection switch 11, one column output signal line 12, one first group selection switch 13, two first group output signal lines 14, and two second group selection switches 15 are shown in FIG. 2 as representatives.

The semiconductor device 100 includes switch arrays 110, 130, and 150 of a first layer to an $n^{th}$ layer having a plurality of switches, and signal lines of the first layer to the $n^{th}$ layer. n is an integer of two or more. The switch array of an $i^{th}$ layer is disposed between the switch array of an $(i+1)^{th}$ layer and the amplifier 7. i is an integer of one or more and less than n.

The switch arrays of the first layer to the $n^{th}$ layer are a group of a plurality of switches. n is three in FIG. 2. Each of the plurality of switches is included in any one of the switch arrays of the first layer to the $n^{th}$ layer. The switch array 150 of the first layer includes the plurality of second group selection switches 15. The switch array 130 of the second layer includes the plurality of first group selection switches 13. The switch array 110 of the third layer includes the plurality of column selection switches 11. The switch array 150 of the first layer is the closest to the amplifier 7 and is the farthest from the plurality of column circuits 5 among the switch arrays of the first layer to the $n^{th}$ layer. The switch array 110 of the third layer is the farthest from the amplifier 7 and is the closest to the plurality of column circuits 5 among the switch arrays of the first layer to the $n^{th}$ layer. The switch array 130 of the second layer is disposed between the switch array 150 of the first layer and the switch array 110 of the third layer.

The switch array 150 of the first layer is disposed between the switch array 130 of the second layer and the amplifier 7, and the switch array 130 of the second layer is disposed between the switch array 110 of the third layer and the amplifier 7. The number of switches included in the switch array of the $(i+1)^{th}$ layer is greater than the number of switches included in the switch array of the $i^{th}$ layer. The plurality of column selection switches 11, the plurality of first group selection switches 13, and the plurality of second group selection switches 15 are arranged in the direction D1 respectively.

A signal line of the first layer is the second group output signal line 16. A signal line of the second layer is the first group output signal line 14. A signal line of the third layer is the column output signal line 12. The signal line of the first layer, that is, the second group output signal line 16, is the closest to the amplifier 7 and is the farthest from the plurality of column circuits 5 among the signal lines of the first layer to the $n^{th}$ layer. The signal line of the third layer, that is, the column output signal line 12, is the farthest from the amplifier 7 and is the closest to the plurality of column circuits 5 among the signal lines of the first layer to the $n^{th}$ layer. The signal line of the second layer, that is, the first group output signal line 14, is disposed between the signal line of the first layer and the signal line of the third layer.

The signal line of the first layer, that is, the second group output signal line 16, is disposed between the signal line of the second layer, that is, the first group output signal line 14, and the amplifier 7, and the signal line of the second layer, that is, the first group output signal line 14, is disposed between the signal line of the third layer, that is, the column output signal line 12, and the amplifier. The plurality of column output signal lines 12 and the plurality of first group output signal lines 14 extend in the direction D1. One second group output signal line 16 extends in the direction D2.

The signal line of the first layer, that is, the second group output signal line 16, is connected to the amplifier 7. A signal line of the $n^{th}$ layer, that is, the column output signal line 12, is connected to the switch array 110 of the $n^{th}$ layer. Each of the plurality of column selection switches 11 included in the switch array 110 of the $n^{th}$ layer is connected to the column circuit 5.

The column selection switch 11 is a transistor. The column selection switch 11 includes a first terminal, a second terminal, and a gate. One of the first terminal and the second terminal of the column selection switch 11 is a source and the other is a drain. The first terminal of the column selection switch 11 is connected to the column circuit 5. The second terminal of the column selection switch 11 is connected to the column output signal line 12. Four column selection switches 11 are connected to one column output signal line 12. The column selection switch 11 is turned on or off on the basis of control signals CSEL[0] to CSEL[15] which are input to a gate of the column selection switch 11. The control signals CSEL[0] to CSEL[15] are output from the horizontal scanning circuit 4.

The first group selection switch 13 is a transistor. The first group selection switch 13 includes a first terminal, a second terminal, and a gate. One of the first terminal and the second terminal of the first group selection switch 13 is a source and the other is a drain. The first terminal of the first group selection switch 13 is connected to the column output signal line 12. The second terminal of the first group selection switch 13 is connected to the first group output signal line 14. Two first group selection switches 13 are connected to one first group output signal line 14. The first group selection switch 13 is turned on or off on the basis of control signals GSEL[0] to GSEL[3] which are input to the gate of the first group selection switch 13. The control signals GSEL[0] to GSEL[3] are output from the horizontal scanning circuit 4.

Each first group selection switch 13 corresponds to four column selection switches 11. That is, each first group selection switch 13 is connected to the column output signal line 12 to which four column selection switches 11 are connected. Four column selection switches 11 constitute one group.

The second group selection switch 15 is a transistor. The second group selection switch 15 includes a first terminal, a second terminal, and a gate. One of the first terminal and the second terminal of the second group selection switch 15 is a source and the other is a drain. The first terminal of the second group selection switch 15 is connected to the first group output signal line 14. The second terminal of the second group selection switch 15 is connected to the second group output signal line 16. The second group selection switch 15 is turned on or off on the basis of control signals LSEL and RSEL which are input to the gate of the second group selection switch 15. The control signals LSEL and RSEL are output from the horizontal scanning circuit 4.

Each second group selection switch 15 corresponds to two first group selection switches 13. That is, each second group selection switch 15 is connected to the first group output signal line 14 to which two first group selection switches 13 are connected. Two first group selection switches 13 constitute one group.

Each of the plurality of switches included in the switch array of the $i^{th}$ layer is connected to two or more of the plurality of switches included in the switch array of the $(i+1)^{th}$ layer by a signal line of the $(i+1)^{th}$ layer. The signal line of the $(i+1)^{th}$ layer is disposed in a first direction. The first direction is the direction D1. Specifically, each of the plurality of second group selection switches 15 included in the switch array 150 of the first layer is connected to two or more of the plurality of first group selection switches 13 included in the switch array 130 of the second layer by the signal line of the second layer, that is, the first group output signal line 14. Each of the plurality of first group selection switches 13 included in the switch array 130 of the second layer is connected to two or more of the plurality of column selection switches 11 included in the switch array 110 of the third layer by the signal line of the third layer, that is, the column output signal line 12.

A first distance between a reference line L1 and a first switch in the direction D1 is less than a second distance between the reference and a second switch in the direction D1. The reference line L1 is a straight line passing through the center C1 of the array of the plurality of pixels 2 and extending in a second direction perpendicular to the direction D1, that is, the direction D2. The first switch is a switch which is the farthest away from the reference line L1 in the direction D1 among the plurality of second group selection switches 15 included in the switch array 150 of the first layer. The second switch is a switch which is the farthest away from the reference line L1 in the direction D1 among the plurality of first group selection switches 13 included in the switch array 130 of the second layer. The first switch is the second group selection switch 15 to which the control signal RSEL is input in FIG. 2. The second switch is the first group selection switch 13 to which the control signal GSEL[3] is input in FIG. 2.

A third distance between the reference line L1 and a third switch in a third direction is less than a fourth distance between the reference line L1 and a fourth switch in the third direction. The third direction is a direction opposite to the first direction, that is, a direction D3. The third switch is a switch which is the farthest away front the reference line L1 in the direction D3 among the plurality of second group selection switches 15 included in the switch array 150 of the first layer. The fourth switch is a switch which is the farthest away from the reference line L1 in the direction D3 among the plurality of first group selection switches 13 included in the switch array 130 of the second layer. The third switch is the second group selection switch 15 to which the control signal LSEL is input in FIG. 2. The fourth switch is the first group selection switch 13 to which the control signal GSEL[0] is input in FIG. 2.

A fifth distance between the reference line L1 and the amplifier 7 in the direction D1 is less than a sixth distance between the reference line L1 and a fifth switch in the direction D1. The fifth switch is a switch which is the closest to the reference line L1 among the plurality of second group selection switches 15 included in the switch array 150 of the first layer. The fifth s itch is one of two second group selection switches 15 in FIG. 2.

Figure 8:
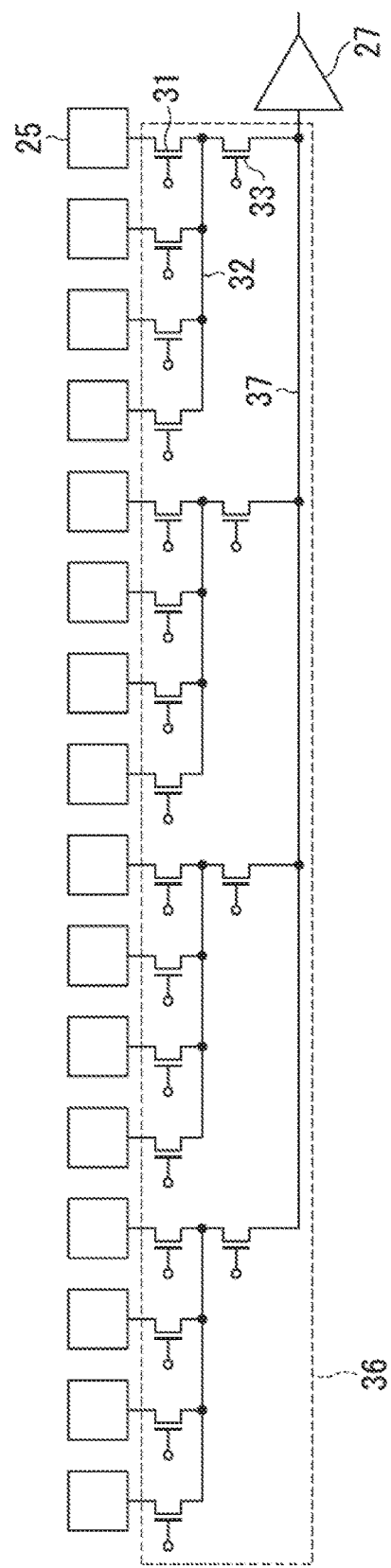
FIG. 8 is a circuit diagram which shows a configuration of a reading circuit of a pixel signal in a prior art.

The signal line of the second layer includes two signal lines. The reference line L1 passes between the two signal lines of the second layer. That is, the signal line of the second layer does not intersect with the reference line L1. The signal line of the second layer includes two first group output signal lines 14 in FIG. 2. The reference line L1 passes between the two first group output signal lines 14. For this reason, the first group output signal line 14 is shorter than a horizontal signal line 37 shown in FIG. 8.

Signal lines of each of the third layer to the $n^{th}$ layer include two signal lines. The reference line L1 may pass between the two signal lines of each of the third layer to the $n^{th}$ layer. That is, the signal line of the third layer to the $n^{th}$ layer may not intersect with the reference line L1. The signal line of the third layer includes two column output signal lines 12 close to the reference line L1 in FIG. 2. The reference line L1 passes between the two column output signal lines 12.

A seventh distance between the reference line L1 and a sixth switch in the direction D1 is less than an eighth distance between the reference line L1 and a seventh switch in the direction D1. The sixth switch is a switch which is the farthest away from the reference line L1 in the direction D1 among a plurality of switches included in the switch array of a $j^{th}$ layer. j is an integer of two or more and less than n. A seventh switch is a switch which is the farthest away from the reference line L1 in the direction D1 among a plurality of switches included in the switch array of a $(j+1)^{th}$ layer. The sixth switch is a switch which is the farthest away from the reference line L1 in the direction D1 among the plurality of first group selection switches 13 included in the switch array 130 of the second layer. That is, the sixth switch is the first group selection switch 13 to which the control signal GSEL[3] is input. The seventh switch is a switch which is the farthest away from the reference line L1 in the direction D1 among the plurality of column selection switches 11 included in the switch array 110 of the third layer in FIG. 2. That is, the seventh switch is the column selection switch 11 to which the control signal CSEL[15] is input.

A ninth distance between the reference line L1 and an eighth switch in the direction D3 is less than a tenth distance between the reference line L1 and a ninth switch in the direction D3. The eighth switch is a switch which is the farthest away from the reference line L1 in the direction D3 among the plurality of switches included in the switch array of the $j^{th}$ layer. The ninth switch is a switch which is the farthest away from the reference line L1 in the direction D3 among the plurality of switches included in the switch array of the $(j+1)^{th}$ layer. The eighth switch is a switch which is the farthest away from the reference line L1 in the direction D3 among the plurality of first group selection switches 13 included in the switch array 130 of the second layer in FIG. 2. That is, the eighth switch is the first group selection switch 13 to which the control signal GSEL[0] is input. The ninth switch is a switch which is the farthest away from the reference line L1 in the direction D3 among the plurality of column selection switches 11 included in the switch array 110 of the third layer in FIG. 2. That is, the ninth switch is the column selection switch 11 to which the control signal CSEL[0] is input.

The amplifier 7 is disposed in the vicinity of the reference line L1. That is, a position of the amplifier 7 in the direction D1 is substantially the same as the center of the plurality of pixels 2 in the direction D1. A length of the second group output signal line 16 may be the shortest according to a relationship of the first to sixth distances. As a result, a length of the first group output signal line 14 is approximately half of a length of the horizontal signal line 37 shown in FIG. 8.

It is known that parasitic capacitance generated between a signal line and a semiconductor substrate is generally proportional to an area of a signal line facing the semiconductor substrate. Since the first group output signal line 14 is short, the parasitic capacitance and resistance are reduced. For this reason, the semiconductor device 100 can read a pixel signal at a higher speed.

A relationship of the seventh distance to the tenth distance may be arbitrary. However when the relationship of the seventh distance to the tenth distance is satisfied, the first group output signal line 14 becomes shorter. Therefore, the parasitic capacitance and the resistance are further reduced. As a result, the semiconductor device 100 can read a pixel signal at a higher speed.

Figure 3:
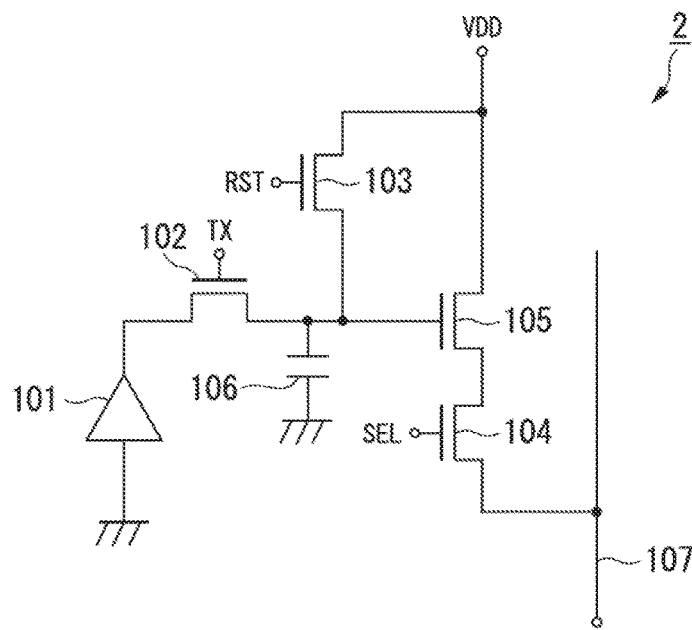
FIG. 3 is a circuit diagram which shows a configuration of a pixel in the semiconductor device according to the first embodiment of the present invention.

FIG. 3 shows a configuration of the pixel 2. As shown in FIG. 3, the pixel 2 includes a photoelectric conversion element 101, a transfer transistor 102, a reset transistor 103, a selection transistor 104, an amplifying transistor 105, and a floating diffusion (FD) 106.

The photoelectric conversion element 101 includes a first terminal and a second terminal. The first terminal of the photoelectric conversion element 101 is connected to the ground. The transfer transistor 102 includes a first terminal, a second terminal, and a gate. One of the first terminal and the second terminal of the transfer transistor 102 is a source and the other is a drain. The first terminal of the transfer transistor 102 is connected to the second terminal of the photoelectric conversion element 101. The gate of the transfer transistor 102 is connected to the vertical scanning circuit 3 and a transfer pulse TX is supplied thereto.

The FD 106 includes a first terminal and a second terminal. The first terminal of the FD 106 is connected to the second terminal of the transfer transistor 102. The second terminal of the FD 106 is connected to the ground. The reset transistor 103 includes a first terminal, a second terminal, and a gate. One of the first terminal and the second terminal of the reset transistor 103 is a source and the other is a drain. The first terminal of the reset transistor 103 is connected to the power supply voltage VDD. The second terminal of the reset transistor 103 is connected to the second terminal of the transfer transistor 102. The gate of the reset transistor 103 is connected to the vertical scanning circuit 3 and a reset pulse RST is supplied thereto.

The amplifying transistor 105 includes a first terminal a second terminal, and a gate. One of the first terminal and the second terminal of the amplifying transistor 105 is a source and the other is a drain. The first terminal of the amplifying transistor 105 is connected to the power supply voltage VDD. The gate which is an input unit of the amplifying transistor 105 is connected to the second terminal of the transfer transistor 102.

The selection transistor 104 includes a first terminal, a second terminal, and a gate. One of the first terminal and the second terminal of the selection transistor 104 is a source and the other is a drain. The first terminal of the selection transistor 104 is connected to the second terminal of the amplifying transistor 105. The second terminal of the selection transistor 104 is connected to a vertical signal line 107. The gate of the selection transistor 104 is connected to the vertical scanning circuit 3 and a selection pulse SEL is supplied thereto.

For example, the photoelectric conversion element 101 is a photodiode. The photoelectric conversion element 101 creates (generates) a charge based on light incident onto the pixel 2 and holds (accumulates) the created (generated) charge. The transfer transistor 102 transfers the charge accumulated in the photoelectric conversion element 101 to the FD 106. ON and OFF of the transfer transistor 102 is controlled by the transfer pulse TX from the vertical scanning circuit 3. The FD 106 is a capacity for temporarily holding (accumulating) the charge transferred from the photoelectric conversion element 101.

The reset transistor 103 resets the FD 106. ON or OFF of the reset transistor 103 is controlled by the reset pulse RST from the vertical scanning circuit 3. The reset transistor 103 and the transfer transistor 102 are tinned on at the same time, and thereby the photoelectric conversion element 101 may also be reset. Resetting of the FD 106 and the photoelectric conversion element 101 includes controlling an amount of charges accumulated in the FD 106 and the photoelectric conversion element 101 and setting a state (potential) of the FD 106 and the photoelectric conversion element 101 to a reference state (reference potential, reset level).

The amplifying transistor 105 outputs an amplified signal, which is obtained by amplifying a signal input to the gate, from the second terminal. The signal input to the gate of the amplifying transistor 105 is based on the charge accumulated in the FD 106. The amplifying transistor 105 and loads placed on the column circuit 5 constitute a source follower circuit.

Figure 4:
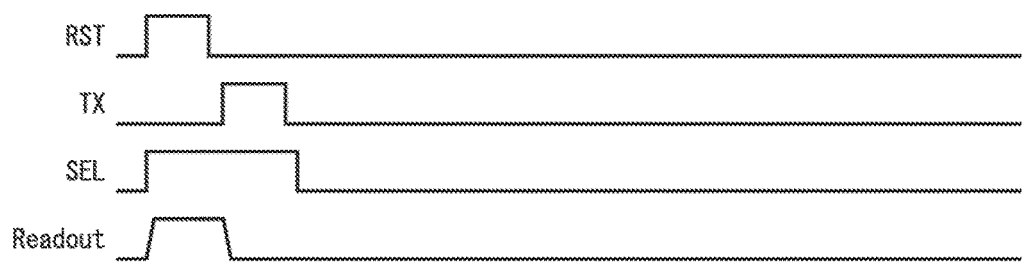
FIG. 4 is a timing chart which shows an operation of the pixel in the semiconductor device according to the first embodiment of the present invention.

FIG. 4 shows an operation of the pixel 2. In FIG. 4, the reset pulse RST, the transfer pulse TX, the selection pulse SEL, and the read pixel signal Readout are shown. In FIG. 4, the horizontal direction represents time and the vertical direction represents a voltage.

The reset pulse RST changes from a low level to a high level, and thereby the reset transistor 103 is turned on. At the same time, the selection pulse SEL changes from the low level to the high level, and thereby the selection transistor 104 is turned on. Accordingly, the second pixel signal is output to the vertical signal line 107. The second pixel signal output to the vertical signal line 107 is held by the column circuit 5.

The reset pulse RST changes from the high level to the low level, and thereby the reset transistor 103 is turned off. Thereafter, the transfer pulse TX changes from the low level to the high level, and thereby the transfer transistor 102 is turned on. As a result, the charge accumulated in the photoelectric conversion element 101 is transferred to the FD 106. At this time, the first pixel signal is output to the vertical signal line 107. The first pixel signal output to the vertical signal line 107 is held by the column circuit 5. The column circuit 5 outputs a signal corresponding to a difference between the first pixel signal and the second pixel signal.

The transfer pulse TX changes from the high level to the low level, and thereby the transfer transistor 102 is turned off. Furthermore, the selection pulse SEL changes from the high level to the low level, and thereby the selection transistor 104 is turned off. The first pixel signal and the second pixel signal are output from the pixel 2 by performing the operations described above.

Figure 5:
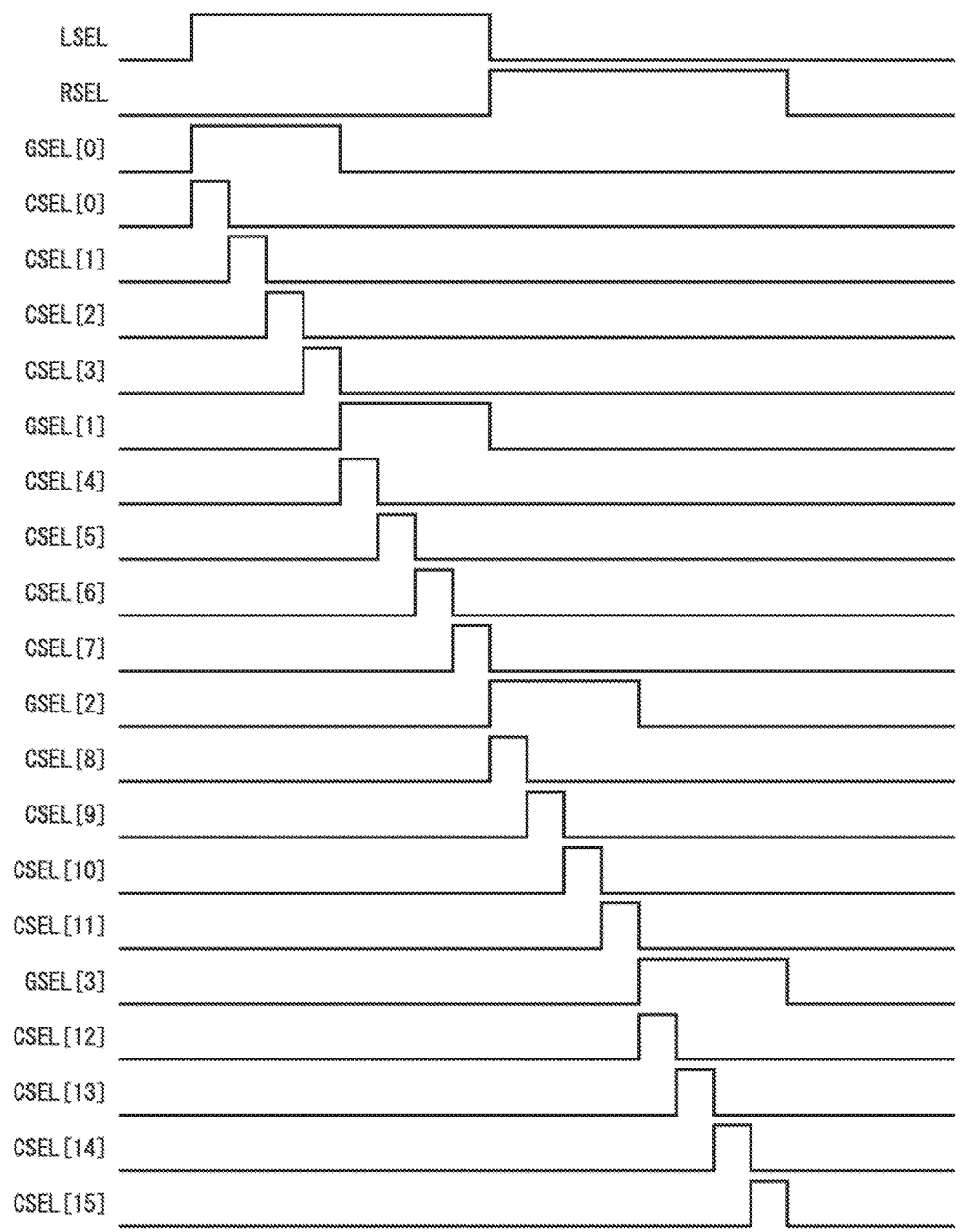
FIG. 5 is a timing chart which shows an operation of a column selection switching unit in the semiconductor device according to the first embodiment of the present invention.

FIG. 5 shows an operation of the column selection switching unit 6. The control signals LSEL and RSEL, control signals GSEL[0] to GSEL[3], and the control signals CSEL [0] to CSEL[15] are shown in FIG. 5. In FIG. 5, a horizontal direction represents time and a vertical direction represents a voltage.

The control signal LSEL, the control signal GSEL[0], and the control signal CSEL[0] change from the low level to the high level at the same time. Accordingly, the second group selection switch 15 on a left end, the first group selection switch 13 on the left end, and the column selection switch 11 on the left end are turned on at the same time. As a result, a signal from one column circuit 5 is output to the amplifier 7. Then, the control signal CSEL[0] changes from the high level to the low level, and thereby the column selection switch 11 is turned off.

In the same manner, the control signals CSEL[1] to CSEL[3] sequentially change in a pulse-like manner. Accordingly, the column selection switches 11 are sequentially turned on from the left to the right. As a result, signals from three column circuits 5 are sequentially output to the amplifier 7. The control signal GSEL[0] changes from the high level to the low level at a timing at which the control signal CSEL[3] changes from the high level to the low level, and thereby the first group selection switch 13 is turned off. Therefore, reading of a pixel signal via four column selection switches 11 constituting one group is completed.

Thereafter, the control signal GSEL[1] changes from the low level to the high level, and thereby the first group selection switch 13 which is the second from the left is turned on. While the first group selection switch 13 is ON, the control signals CSEL[4] to CSEL[7] sequentially change in a pulse-like manner. Accordingly, the column selection switch 11 is sequentially turned on from the left to the right. As a result, signals from four column circuits 5 are sequentially output to the amplifier 7. The control signal GSEL[1] changes from the high level to the low level at a timing at which the control signal CSEL[7] changes from the high level to the low level, and the first group selection switch 13 is turned off. Accordingly, the reading of a pixel signal via the four column selection switches 11 constituting one group is completed.

The control signal LSEL is turned off at a timing at which the control signal CSEL[7] and the control signal GSEL[1] change from the high level to the low level, and thereby the second group selection switch 15 on the left end is turned off. At the same time, the control signal RSEL is turned on, and thereby the second group selection switch 15 on the right end is turned on. At the same time, the control signal GSEL[2] changes from the low level to the high level, and the first group selection switch 13 which is the third from the left is turned on. While the first group selection switch 13 is ON, the control signals CSEL[8] to CSEL[11] sequentially change in a pulse-like manner. Accordingly, the column selection switches 11 are sequentially turned on from the left to the right. As a result, signals from four column circuits 5 are sequentially output to the amplifier 7. The control signal GSEL[2] changes from the high level to the low level at a timing at which the control signal CSEL[11] changes from the high level to the low level, and the first group selection switch 13 is turned off, and thereby the reading of a pixel signal via the four column selection switches 11 constituting one group is completed.

Thereafter, the control signal GSEL[3] changes from the low level to the high level, and the first group selection switch on the right end is turned on. While the first group selection switch 13 is ON, the control signals CSEL[12] to CSEL[15] sequentially change in a pulse-like manner. According the column selection switches 11 are sequentially turned on from the left to the right. As a result, signals from four column circuits 5 are sequentially output to the amplifier 7. The control signal GSEL[3] changes from the high level to the low level at a timing at which the control signal CSEL[15] changes from the high level to the low level, and thereby the first group selection switch 13 is turned off. Accordingly, the reading of a pixel signal via the four column selection switches 11 constituting one group is completed.

Signals are sequentially read from the plurality of column circuits 5 by column by changing a state of each switch as described above.

A first width of the signal line of the first layer may be less than a second width of the signal line of the second layer. That is, the first width of the second group output signal line 16 may be less than the second width of the first group output signal line 14. A value of the parasitic capacitance generated between a signal wiring and a semiconductor substrate is proportional to a product of the length and the width of a signal line. The parasitic capacitance is further reduced by decreasing the width of a signal line. However, a resistance value increases when the width of a signal line decreases. Due to an increase resistance value, a reading speed decreases. The second group output signal line 16 is shorter than the plurality of column output signal lines 12 and the plurality of first group output signal lines 14. For this reason, even when the width of the second group output signal line 16 is small, an increase in resistance formed between the column circuit 5 and the amplifier 7 is suppressed.

(First Modification)

Figure 6:
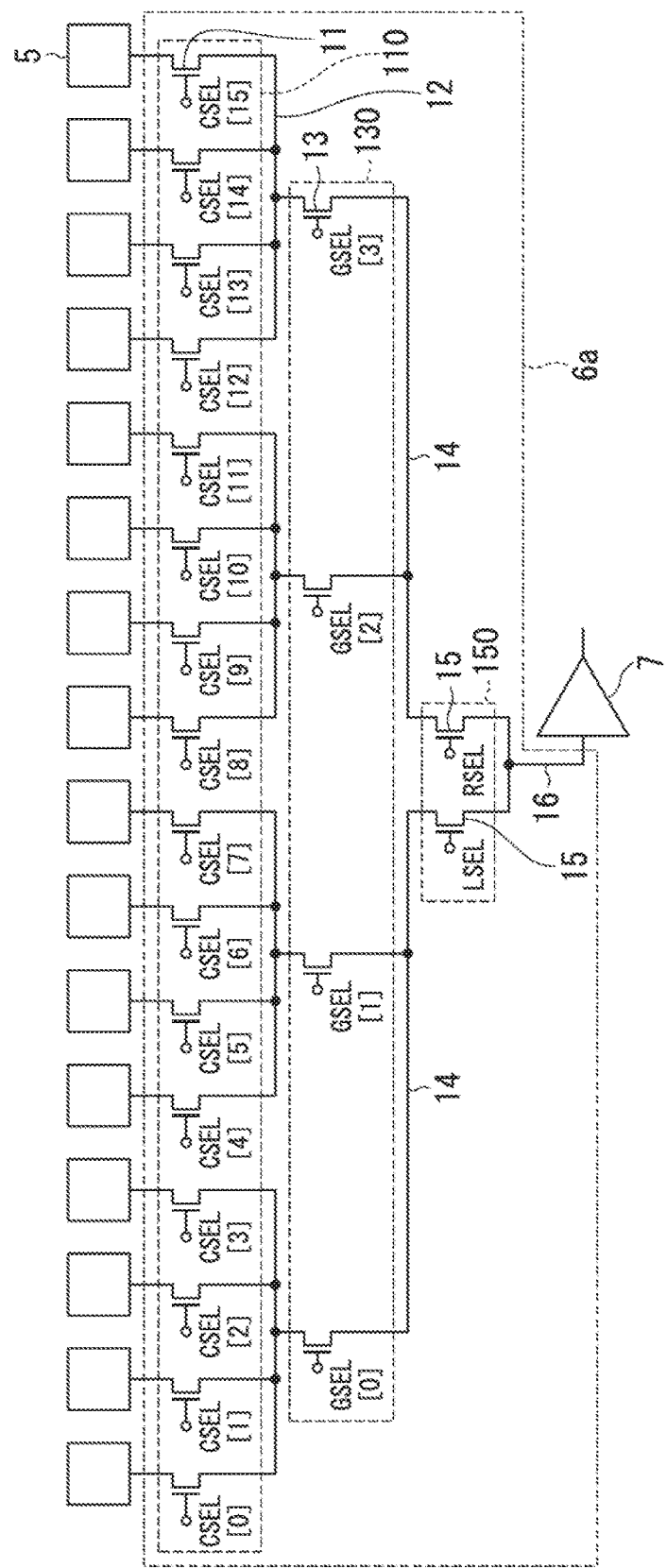
FIG. 6 is a circuit diagram which shows a configuration of a column selection switching unit in a semiconductor device according to a first modification of the first embodiment of the present invention.

FIG. 6 shows a configuration of a column selection switching unit 6a of a first modification. As shown in FIG. 6, the column selection switching unit 6a includes a plurality of column selection switches 11, a plurality of column output signal lines 12, a plurality of first group selection switches 13, a plurality of first group output signal lines 14, a plurality of second group selection switches 15, and one second group output signal line 16.

Differences between the configuration shown in FIG. 6 and the configuration shown in FIG. 2 will be described. The first group selection switch 13 is connected to the left end of the column output signal line 12 in FIG. 2. In FIG. 6, the first group selection switch 13 is connected to the center of the column output signal line 12. For this reason, the first group output signal line 14 in FIG. 6 is longer than the first group output signal line 14 in FIG. 2. However, a length of the column output signal line 12 is sufficiently less than a length of the first group output signal line 14. For this reason, an increase in the length of the first group output signal line 14 in FIG. 6 is small. Therefore, an increase in parasitic capacitance and resistance of the first group output signal line 14 is for the configuration shown in FIG. 2 is small.

With respect to points other than those described above, the configuration shown in FIG. 6 is the same as the configuration shown in FIG. 2.

(Second Modification)

Figure 7:
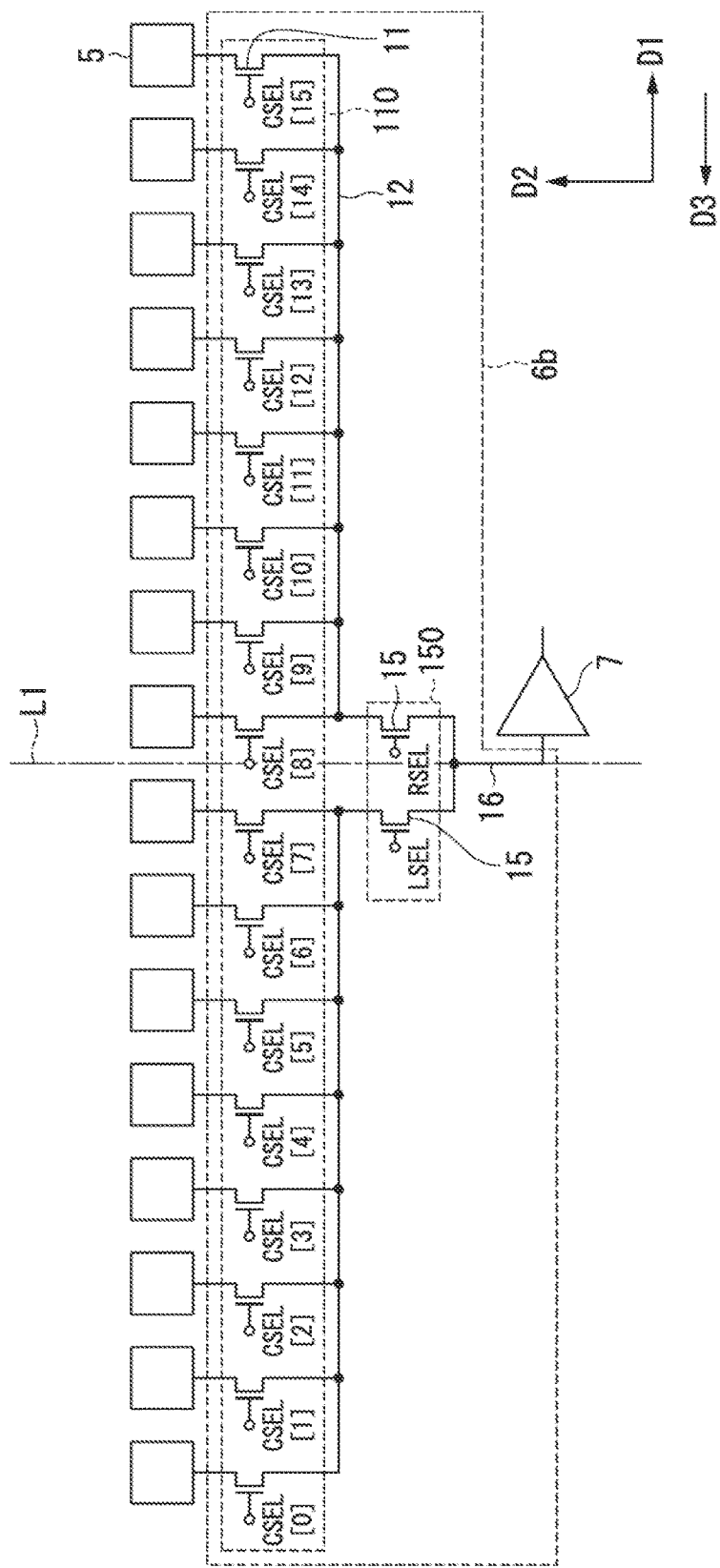
FIG. 7 is a circuit diagram which shows a configuration of a column selection switching unit in a semiconductor device according to a second modification of the first embodiment of the present invention.

FIG. 7 shows a configuration of a column selection switching unit 6b of a second modification. As shown in FIG. 7, the column selection switching unit 6b includes a plurality of column selection switches 11, a plurality of column output signal lines 12, a plurality of second group selection switches 15, and one second group output signal line 16.

Differences between the configuration shown in FIG. 7 and the configuration shown in FIG. 2 will be described. A plurality of first group selection switches 13 and a plurality of first group output signal lines 14 are not arranged in FIG. 7. The first terminal of the second group selection switch 15 is connected to the column output signal line 12.

A semiconductor device 100 of the second modification includes switch arrays 110 and 150 of a first layer to a second layer which include a plurality of switches, and signal lines of the first layer to the second layer. The switch array 150 of the first layer is disposed between the switch array 110 of the second layer and an amplifier 7. The signal line of the first layer is the second group output signal line 16. The signal line of the second layer is the column output signal line 12. Each of the plurality of second group selection switches 15 included in the switch array 150 of the first layer is connected to two or more of the plurality of column selection switches 11 included in the switch array 110 of the second layer and the signal line of the second layer, that is, the column output signal line 12.

A first distance between a reference line L1 and a first switch is less than a second distance between the reference line L1 and a second switch in a direction D1. The first switch is a switch which is the farthest away from the reference line L1 in the direction D1 among the plurality of second group selection switches 15 included in the switch array 150 of the first layer. The second switch is a switch which is the farthest away from the reference line L1 in the direction D1 among the plurality of column selection switches 11 included in the switch array 110 of the second layer. The first switch is the second group selection switch 15 to which a control signal RSEL is input in FIG. 7. The second switch is the column selection switch 11 to which a control signal CSEL[15] is input in FIG. 7.

A third distance between the reference line L1 and a third switch in a direction D3 is less than a fourth distance between the reference line and a fourth switch in the direction D3. The third switch is a switch which is the farthest away from the reference line L1 in the direction D3 among the plurality of second group selection switches 15 included in the switch array 150 of the first layer. The fourth switch is a switch which is the farthest away from the reference line L1 in the direction D3 among the plurality of column selection switches 11 included in the switch array 110 of the second layer. The third switch is the second group selection switch 15 to which a control signal LSEL is input in FIG. 7. The fourth switch is the column selection switch 11 to which a control signal CSEL[0] is input in FIG. 7.

With respect to points other than those described above, the configuration shown in FIG. 7 is the same as the configuration shown in FIG. 2.

According to the embodiments of the present invention, the semiconductor device 100 includes the pixel array 1, the plurality of column circuits 5, the amplifier 7, the switch arrays 110, 130, and 150 of the first layer to the $n^{th}$ layer, and the signal lines (the column output signal line 12, the first group output signal line 14, and the second group output signal line 16) of the first layer to the $n^{th}$ layer.

The semiconductor device of each aspect of the present invention may not include at least one of the vertical scanning circuit 3 and the horizontal scanning circuit 4. For example, the vertical scanning circuit 3 and the horizontal scanning circuit 4 may also be disposed on a substrate different from a semiconductor substrate on which the pixel array 1, the column circuit 5, the column selection switching unit 6, and the amplifier 7 are disposed.

In the embodiments of the present invention, the semiconductor device 100 which includes switch arrays of two or three layers and signal lines of two or three layers has been described. The semiconductor device of each aspect of the present invention may also include switch arrays of four layers or more and signal lines of four layers or more.

In the embodiments of the present invention, the first distance between the reference line L1 and the second group selection switch 15 on the right end in the direction D1 is less than the second distance between the reference line L1 and the first group selection switch 13 on the right end in the direction D1. The third distance between the reference line L1 and the second group selection switch 15 on the left end in the direction D3 is less than the fourth distance between the reference line L1 and the first group selection switch 13 on the left end in the direction D3. The fifth distance between the reference line L1 and the amplifier 7 in the first direction is less than the sixth distance between the reference line L1 and the second group selection switch 15 in the first direction. The reference line L1 passes between two first group output signal lines 14 of the second layer. For this reason, the parasitic capacitance and resistance of a signal line are reduced. Therefore, it is possible to read a pixel signal at a higher speed.

The seventh distance between the reference line L1 and the first group selection switch 13 on the right end in the direction D1 is less than the eighth distance between the reference line L1 and the column selection switch 11 on the right end in the direction D1. The ninth distance between the reference line L1 and the first group selection switch 13 on the left end in the direction D3 is less than the tenth distance between the reference line L1 and the column selection switch 11 on the left end in the direction D3. For this reason, the parasitic capacitance and resistance of a signal line is further reduced. Therefore, it is possible to read a pixel signal at a higher speed.

The first width of the second group output signal line 16 may be less than the second width of the first group output signal line 14. Accordingly, the parasitic capacitance is further reduced. The second group output signal line 16 is short. For this reason, an increase in the resistance formed between the column circuit 5 and the amplifier 7 by decreasing the width of the second group output signal line 16 is suppressed.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly the invention is not to be considered as being limited by the foregoing description and is only limited by the scope of the appended claims.

What is claimed is:
1. A semiconductor device, comprising:
a pixel array which includes a plurality of pixels arranged in a matrix, the plurality of pixels outputting pixel signals;
a plurality of column circuits which are arranged to correspond to columns of the plurality of pixels and process the pixel signals;
an amplifier configured to amplify signals output from the plurality of column circuits;
switch arrays of a first layer to an $n^{th}$ layer, the switch array including a plurality of switches; and
signal lines of the first layer to the $n^{th}$ layer,
wherein n is an integer of two or more,
the switch array of an $i^{th}$ layer is disposed between the switch array of an $(i+1)^{th}$ layer and the amplifier, i being an integer of one or more and less than n,
the signal line of the first layer is connected to the amplifier,
the signal line of the $n^{th}$ layer is connected to the switch array of the $n^{th}$ layer,
each of the plurality of switches included in the switch array of the $n^{th}$ layer is connected to the column circuit,
each of the plurality of switches included in the switch array of the $i^{th}$ layer is connected to two or more of the plurality of switches included in the switch array of the $(i+1)^{th}$ layer by the signal line of the $(i+1)^{th}$ layer, the signal line of the $(i+1)^{th}$ layer is disposed in a first direction, and the first direction is a row direction,
a first distance between a reference line and a first switch in the first direction is less than a second distance between the reference line and a second switch in the first direction, and the reference line is a straight line passing through the center of an array of the plurality of pixels and extending in a second direction perpendicular to the first direction,
the first switch is the switch which is the farthest away from the reference line in the first direction among the plurality of switches included in the switch array of the first layer, the second switch is the switch which is the farthest away from the reference line in the first direction among the plurality of switches included in the switch array of the second layer, a third distance between the reference line and a third switch in a third direction is less than a fourth distance between the reference line and a fourth switch in the third direction, and the third direction is a direction opposite to the first direction, the third switch is the switch which is the farthest away from the reference line in the third direction among the plurality of switches included in the switch array of the first layer, the fourth switch is the switch which is the farthest away from the reference line in the third direction among the plurality of switches included in the switch array of the second layer, a fifth distance between the reference line and the amplifier in the first direction is less than a sixth distance between the reference line and a fifth switch in the first direction, the fifth switch is the switch which is the closest to the reference line among the plurality of switches included in the switch array of the first layer, the signal line of the second layer includes two signal lines, and the reference line passes between the two signal lines of the second layer, a seventh distance between the reference line and a sixth switch in the first direction is less than an eighth distance between the reference line and a seventh switch in the first direction, the sixth switch is the switch which is the farthest away from the reference line in the first direction among the plurality of switches included in the switch array of a $j^{th}$ layer, j being an integer of two or more and less than n, the seventh switch is the switch which is the farthest away from the reference line in the first direction among the plurality of switches included in the switch array of a $(j+1)^{th}$ layer, a ninth distance between the reference line and an eighth switch in the third direction is less than a tenth distance between the reference line and a ninth switch in the third direction, the eighth switch is the switch which is the farthest away from the reference line in the third direction among the plurality of switches included in the switch array of the $j^{th}$ layer, the ninth switch is the switch which is the farthest away from the reference line in the third direction among the plurality of switches included in the switch array of the $(j+1)^{th}$ layer, and a first width of the signal line of the first layer is less than a second width of the signal line of the second layer.

2. The semiconductor device according to claim 1,
wherein the plurality of pixels output a first pixel signal in accordance with an amount of incident light, and
the plurality of column circuits hold the first pixel signal.

3. The semiconductor device according to claim 2,
wherein the plurality of pixels further output a second pixel signal when the plurality of pixels are reset,
the plurality of column circuits further hold the second pixel signal, and
the plurality of column circuits further output a signal corresponding to a difference between the first pixel signal and the second pixel signal.

\* \* \* \* \*